US007081800B2

(12) United States Patent
He et al.

(10) Patent No.: US 7,081,800 B2
(45) Date of Patent: Jul. 25, 2006

(54) PACKAGE INTEGRATED ONE-QUARTER WAVELENGTH AND THREE-QUARTER WAVELENGTH BALUN

(75) Inventors: Jianggi He, Gilbert, AZ (US); Udy Shrivastava, Tempe, AZ (US); Chee Hoo Lee, Perak (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/883,405

(22) Filed: Jun. 30, 2004

(65) Prior Publication Data

US 2006/0001501 A1 Jan. 5, 2006

(51) Int. Cl.
*H03H 7/42* (2006.01)

(52) U.S. Cl. ........................................ 333/26; 333/25

(58) Field of Classification Search ................ 333/25, 333/26; 330/301

See application file for complete search history.

(56) References Cited

U.S. PATENT DOCUMENTS 6,424,227 B1 * 7/2002 El-Sharawy ................ 330/307
6,803,835 B1 * 10/2004 Frank .......................... 333/26

* cited by examiner

*Primary Examiner*—Dean Takaoka
(74) *Attorney, Agent, or Firm*—Blakely, Sokoloff, Taylor & Zafman LLP

(57) ABSTRACT

According to embodiments of the present invention, a balun is disposed on a package that is to receive a die. In embodiments, the balun includes a first metal trace disposed on a first base and a second metal trace disposed on a second base. In embodiments, the first metal trace is one-quarter wavelength of an operating wavelength for a radio frequency (RF) signal and the second metal trace is three-quarters wavelength of the wavelength.

22 Claims, 4 Drawing Sheets

100

PACKAGE INTEGRATED ONE-QUARTER WAVELENGTH AND THREE-QUARTER WAVELENGTH BALUN

BACKGROUND

1. Field

Embodiments of the present invention relate to wireless radio frequency systems and, in particular, to baluns in wireless radio frequency systems.

2. Discussion of Related Art

Many wireless radio frequency (RF) applications, such as televisions, wireless telephones, and personal digital assistants (PDAs), receive unbalanced, single-ended signals and convert them to balanced, differential signals for downstream processing. A line is unbalanced when the signal being transmitted over the line has ground as its reference potential. A line is balanced when the signal being transmitted over the line does not have ground as its reference potential.

Baluns are commonly used to convert unbalanced, single-ended signals to balanced, differential signals with each signal having substantially the same magnitude but being one hundred eighty degrees out of phase with each other. For example, it is typical to fine a balun is placed between a twisted pair of wires on a television antenna (balanced line) and the coaxial cable going to the television (unbalanced line). The term balun comes from combining the word "balanced" with the word "unbalanced."

Baluns used in many present-day applications such as small, hand-held RF wireless devices have limitations, however. For example, they tend to be "expensive" components in that they are located on the dies of other components (e.g., on-die or on-silicon), and die space is very limited. Because they take up die space there is less space available for other on-die components.

This also means that on-die baluns also are limited in size in an effort to accommodate other on-die components. Size limitations limit the signal-to-noise ratio (SNR), signal sensitivity, and the quality (Q) factor of baluns.

Baluns used in many present-day applications such as small, hand-held RF wireless devices also tend to be low performance components. This is because as current flows through the small traces of the baluns some of the signal magnitude is lost due to heat dissipation and lossiness. The balanced, differential signal is thus degraded.

BRIEF DESCRIPTION OF THE DRAWINGS

In the drawings, like reference numbers generally indicate identical, functionally similar, and/or structurally equivalent elements. The drawing in which an element first appears is indicated by the leftmost digit(s) in the reference number, in which.

DETAILED DESCRIPTION OF THE ILLUSTRATED EMBODIMENTS

Figure 1:
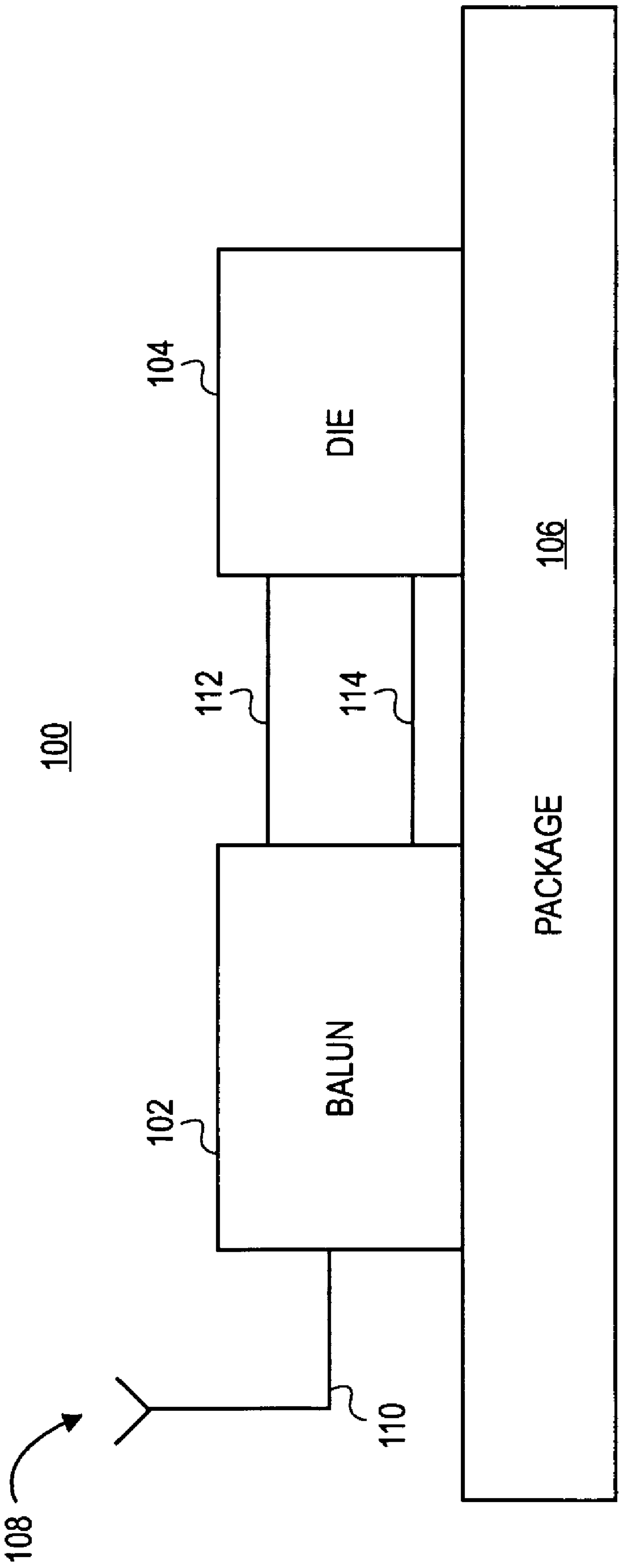
FIG. 1 is a high-level block diagram of a system according to an embodiment of the present invention.

FIG. 1 is a high-level block diagram of a system 100 according to an embodiment of the present invention. The system 100 includes a balun 102 disposed on a package 106 that may receive a die 104. Because the example balun 102 is not on the die 104 (on-die), the balun 102 does not they take up costly space on the die 104 and there is more space available for other on-die components. Additionally, the size of the balun 102 is not limited by the size of the die 104, which means that the quality (Q) factor is not limited by the size of the die 104.

In the illustrated embodiment, the balun 102 is coupled to an antenna 108 via a single-ended, unbalanced line 110, and to the die 104 via balanced, differential lines 112 and 114. In operation, the antenna 108 may receive a single-ended, unbalanced radio frequency (RF) signal, the balun 102 may convert the single-ended, unbalanced RF signal to a balanced, differential signal, and components (not shown) on the die 104 may process the balanced, differential signal according to the functions of the die 104.

Figure 2:
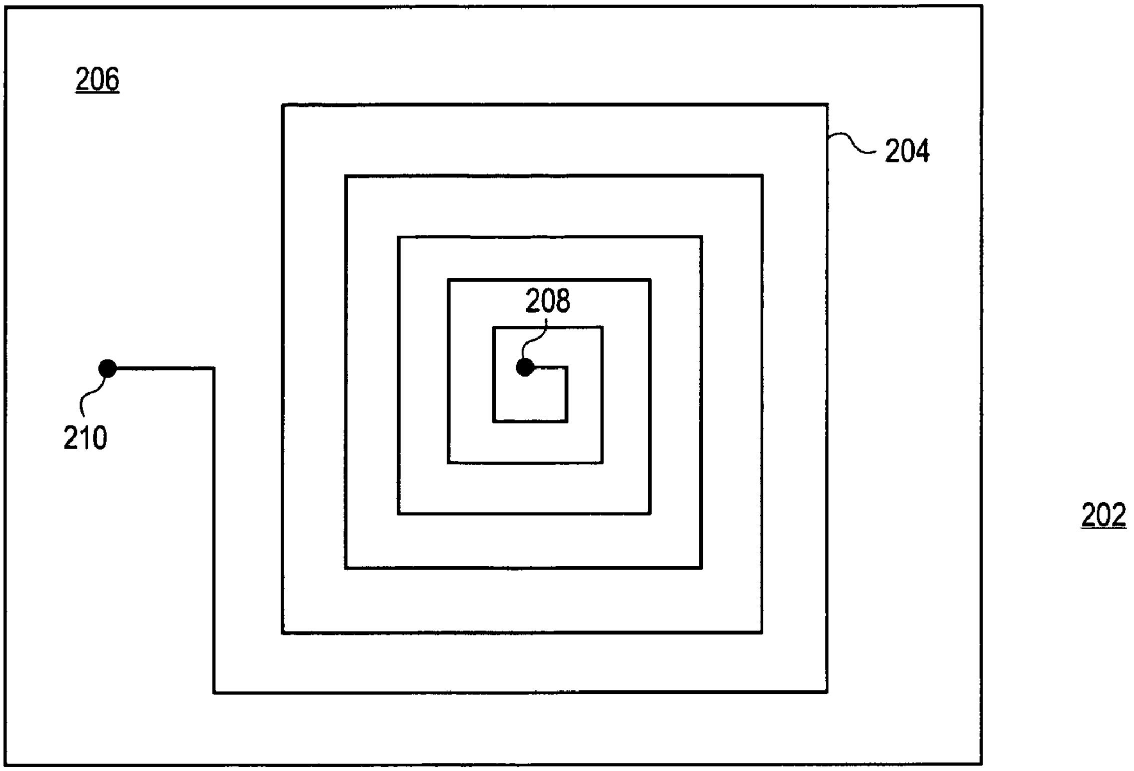
FIG. 2 is a top view of a portion of the balun depicted in FIG. 1 according to an embodiment of the present invention.
Figure 3:
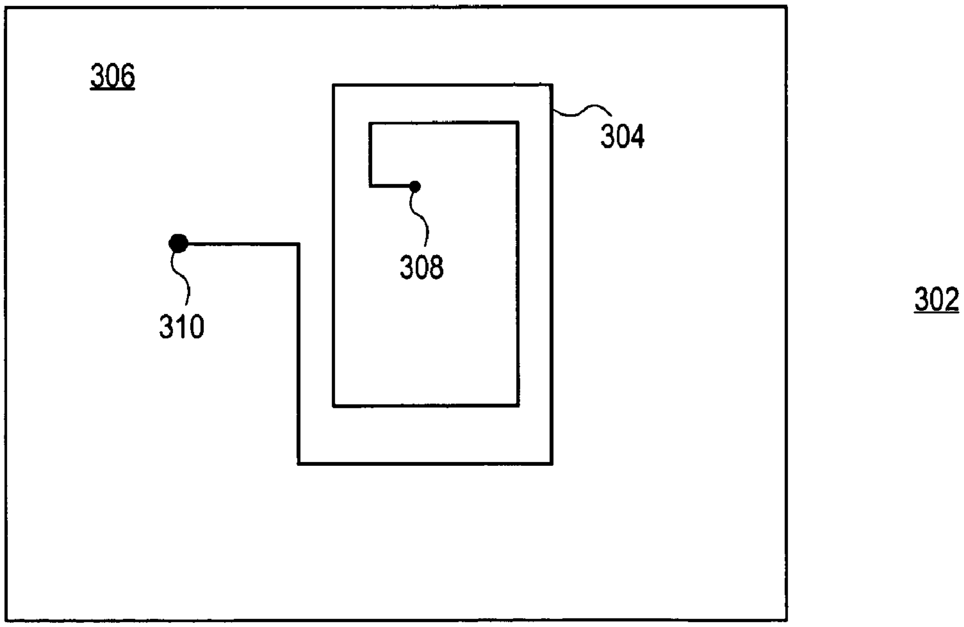
FIG. 3 is a top view of a portion of the balun depicted in FIG. 1 according to an alternative embodiment of the present invention.

FIG. 2 is a top view of a portion 202 of the balun 102 according to an embodiment of the present invention. The portion 202 includes a metal trace 204 formed in or on a base 206. FIG. 3 is a top view of a portion 302 of the balun 102 according to an embodiment of the present invention. The portion 302 includes a metal trace 304 formed in or on a base 306. In embodiments of the present invention, the metal traces 204 and 304 are coils, inductors, or spiral transmission lines that are wound in the same direction.

The RF signal has an operating wavelength. In embodiments of the present invention the length of the metal trace 204 is three-quarters of the operating wavelength and the length of the metal trace 304 is one-quarter of the operating wavelength.

The metal traces 204 and 304 have end 208 and 308 to receive the single-ended, unbalanced RF signal and ends 210 and 310 to output the balanced, differential signal. In one embodiment, the signal output of the end 210 is one hundred eighty degrees out of phase with the signal output of the end 310, but is substantially the same magnitude as the signal output of the end 310.

In the illustrated embodiments, the metal traces 204 and 304 have a square shape, but embodiments are not so limited. For example, the metal traces 204 and 304 may be circular, spiral, rectangular, octagonal, or other suitable shape. After reading the description herein, a person of ordinary skill in the relevant art will readily recognize how to implement the metal traces 204 and 304 using other shapes.

In embodiments of the invention, the portions 202 and 302 may be fabricated using known packaging transmission line etching technology. For example, the base 206 may be a dielectric material (e.g., organic, low loss, ceramic, FR-4)). The metal trace 204 may be fabricated by depositing a layer of copper on the surface of the dielectric material. Portions of the copper may be etched away to leave the metal trace 204 (or other coil, transmission line, or inductor having the length and pattern for the particular application).

Figure 4:
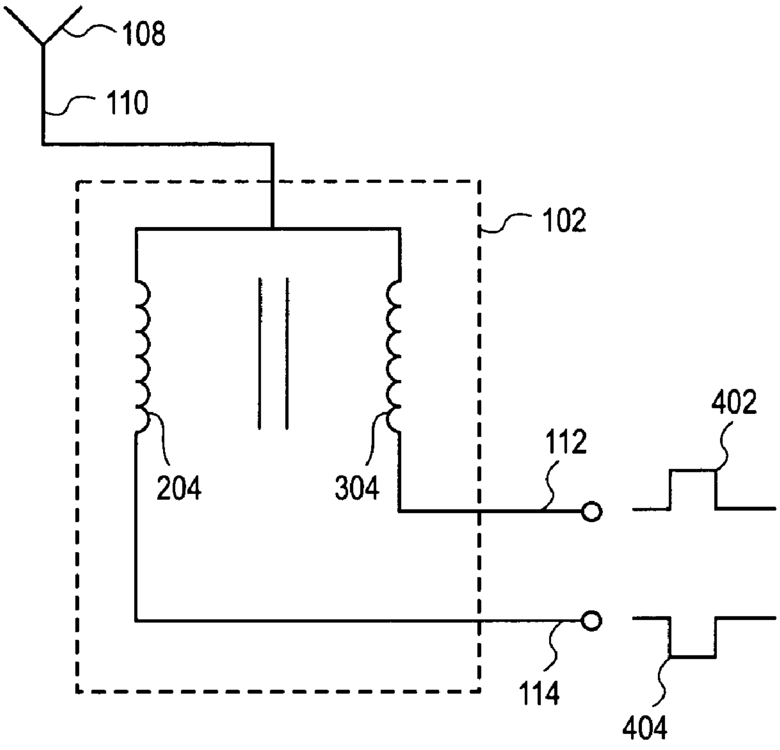
FIG. 4 is a schematic diagram of the balun depicted in FIG. 1 according to an alternative embodiment of the present invention.

FIG. 4 is a schematic diagram of the balun 102 according to an alternative embodiment of the present invention. In the illustrated embodiment, the antenna 108 receives the RF signal and couples it to the balun 102 via the single-ended, unbalanced line 110. Current in the RF signal passes through the metal trace 204 and the metal trace 304, and electromagnetic fields are developed around the metal traces 204 and 304 and coupled to each other. Because the metal trace 204 is three-quarters of a wavelength long and the metal trace 304 is one-quarter of a wavelength long (e.g. a one-half wavelength difference), the output 402 on the line 112 is one hundred eighty degrees out of phase with the output 404 on the line 114.

Figure 5:
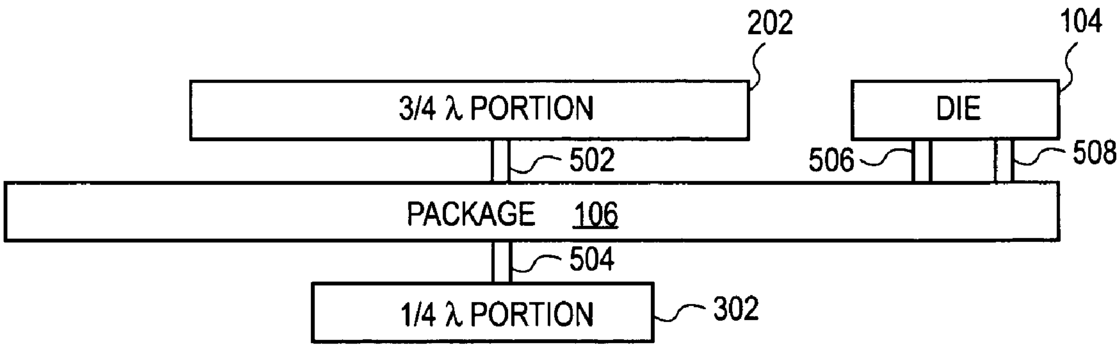
FIG. 5 is a cross-section diagram of the system depicted in FIG. 1 according to an embodiment of the present invention.

FIG. 5 is a cross-section diagram of the system 100 according to an embodiment of the present invention in which the portion 202 is disposed on the package 106 via an interconnect 502, the portion 302 is disposed on the package 106 via an interconnect 504, and the die 104 202 is disposed on the package 106 via die bumps 506 and 508.

In embodiments, the total electrical length of the metal trace 204, which includes interconnects from the die bumps 506 and 508 to the metal traces 204 and/or 304, may be adjusted to control any phase imbalance. In one embodiment, the spacing between and width of the metal traces 204 and 304 may determine the magnitude of any phase imbalance the balun 102. Also, in one embodiment, the spaces between and width of the metal traces 204 and 304 may be designed such that the balun 102 may be implemented as an impedance transformer. After reading the description herein, a person of ordinary skill in the relevant art will readily recognize how to adjust the spacing and/or widths of the metal traces 204 and 304 to implement the balun 102 as an impedance transformer.

Figure 6:
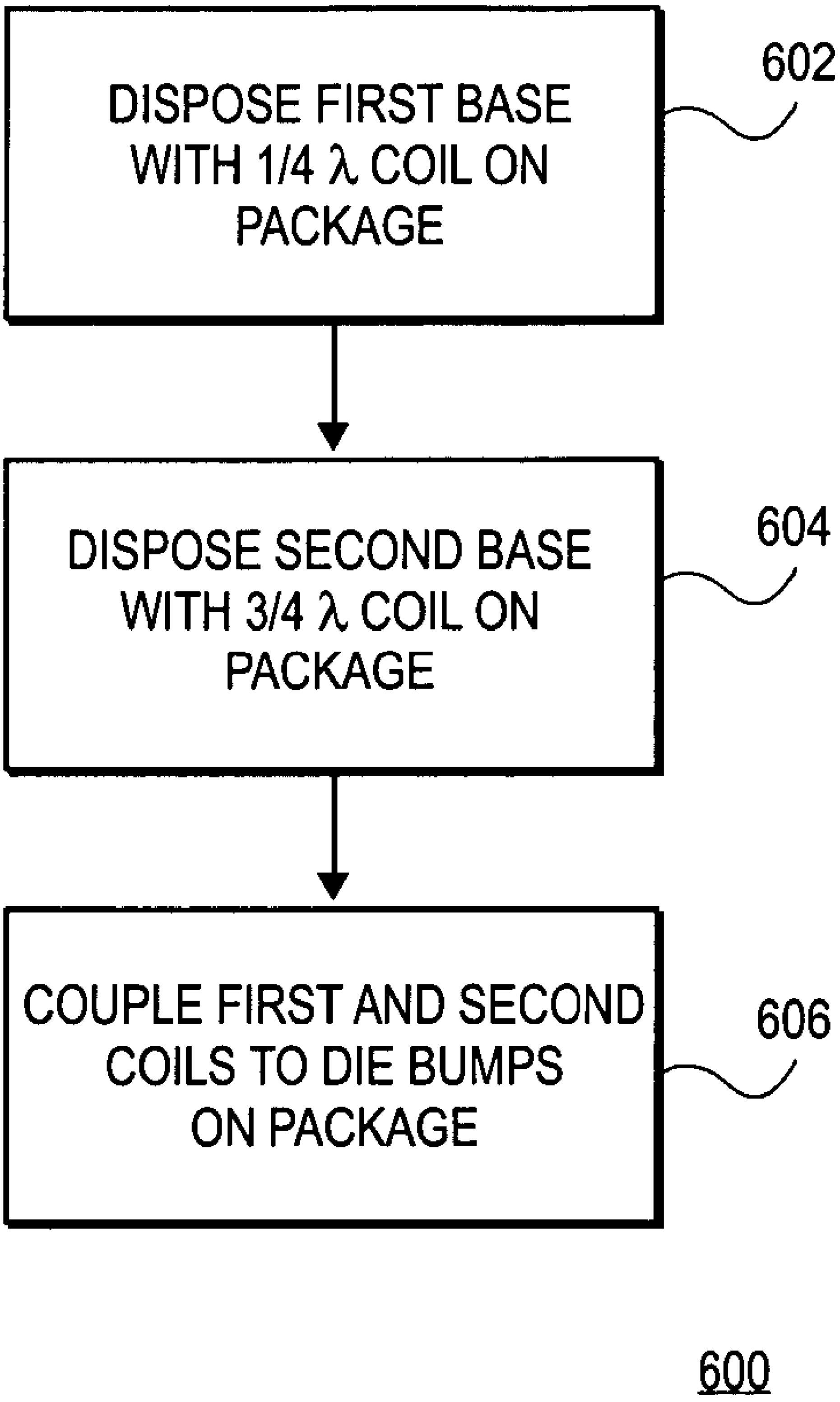
FIG. 6 is a flowchart illustrating an approach to fabricating the system depicted in FIG. 1 according to an embodiment of the present invention.

FIG. 6 is a flowchart illustrating a process 600 for fabricating the system 100 according to an embodiment of the present invention. The operations of the process 600 are described as multiple discrete blocks performed in turn in a manner that is most helpful in understanding embodiments of the invention. However, the order in which they are described should not be construed to imply that these operations are necessarily order dependent or that the operations be performed in the order in which the blocks are presented.

Of course, the process 600 is only an example process and other processes may be used to implement embodiments of the present invention. A machine-accessible medium with machine-readable instructions thereon may be used to cause a machine (e.g., a processor) to perform the process 600.

In a block 602, the portion 202 is disposed on the package 106.

In a block 604, the portion 302 is disposed on the package 106.

In a block 606, the portions 202 and 302 are coupled to die bumps 506 and 508. In one embodiment, the package 106 has multiple layers, such as eight or ten layers, for example, and the portions 202 and 302 are etched at the bottom layer.

Embodiments of the present invention may be implemented using hardware, software, or a combination thereof. In implementations using software, the software may be stored on a machine-accessible medium.

A machine-accessible medium includes any mechanism that provides (i.e., stores and/or transmits) information in a form accessible by a machine (e.g., a computer, network device, personal digital assistant, manufacturing tool, any device with a set of one or more processors, etc.). For example, a machine-accessible medium includes recordable and non-recordable media (e.g., read only memory (ROM), random access memory (RAM), magnetic disk storage media, optical storage media, flash memory devices, etc.), as well as electrical, optical, acoustic, or other form of propagated signals (e.g., carrier waves, infrared signals, digital signals, etc.).

In the above description, numerous specific details, such as particular processes, materials, devices, and so forth, are presented to provide a thorough understanding of embodiments of the invention. One skilled in the relevant art will recognize, however, that the embodiments of the present invention may be practiced without one or more of the specific details, or with other methods, components, etc. In other instances, well-known structures or operations are not shown or described in detail to avoid obscuring the understanding of this description.

Reference throughout this specification to "one embodiment" or "an embodiment" means that a particular feature, structure, process, block, or characteristic described in connection with an embodiment is included in at least one embodiment of the present invention. Thus, the appearance of the phrases "in one embodiment" or "in an embodiment" in various places throughout this specification does not necessarily mean that the phrases all refer to the same embodiment. The particular features, structures, or characteristics may be combined in any suitable manner in one or more embodiments.

The terms used in the following claims should not be construed to limit embodiments of the invention to the specific embodiments disclosed in the specification and the claims. Rather, the scope of embodiments of the invention is to be determined entirely by the following claims, which are to be construed in accordance with established doctrines of claim interpretation.

What is claimed is:

1. An apparatus, comprising:

a package to receive a die; and a balun disposed on the package, the balun to convert a first impedance to a second impedance, the balun having:

a first inductor disposed on a first base, the first inductor having a first length equivalent to one-quarter of an operating wavelength; and a second inductor disposed on a second base, the second inductor having a second length equivalent to three-quarters of the operating wavelength.

2. The apparatus of claim 1, wherein the first inductor includes a first end and the second inductor includes a second end, the first and the second ends to input a first signal, and wherein the first inductor includes a third end and the second inductor includes a fourth end, the third end to output a second signal, and the fourth end to output a third signal.

3. The apparatus of claim 2, wherein the second signal is 180 degrees out of phase with the third signal.

4. The apparatus of claim 3, wherein the second signal has a magnitude that is substantially equal to the third signal.

5. The apparatus of claim 1, wherein the first and/or the second inductor includes a shape that is at least one of a circular shape, a spiral shape, rectangular shape, spiral shape, or octagonal shape.

6. The apparatus of claim 1, wherein the first and/or second base is comprised of low loss material.

7. The apparatus of claim 6, wherein the first and/or the second base is comprised of organic material and the first and/or the second inductor is a copper trace disposed in or on the organic material.

8. The apparatus of claim 6, wherein the first and/or the second base is comprised of ceramic material and the first and/or the second inductor is a copper trace disposed in or on the ceramic material.

9. An apparatus, comprising:

a first metal trace disposed on a first base, the first metal trace having a first length equivalent to one-quarter of a predetermined wavelength;

a second metal trace disposed on a second base, the second metal trace having a second length equivalent to three-quarters of the predetermined wavelength; and a package to receive a die, the first and the second bases disposed on the package.

10. The apparatus of claim 9, wherein the first and/or the second metal trace includes a shape that is at least one of a circular shape, a spiral shape, a rectangular shape, or an octagonal shape.

11. The apparatus of claim 9, wherein the first and the second metal traces forming an impedance transformer.

12. A method, comprising:

passing a current from a radio frequency (RF) signal through a first coil to develop an electromagnetic field, the first coil disposed on a first base, the first coil having a first length equivalent to one-quarter of a wavelength of an operating frequency of the RF signal; and passing the current through a second coil to develop an electromagnetic field, the second coil disposed on a second base, the second coil having a second length equivalent to three-quarters of the predetermined wavelength, the first and the second bases disposed on a package, the package to receive a die.

13. The method of claim 12, further comprising:

providing a first output from the first coil; and providing a second output from the second coil, the first output having a phase that is one hundred eighty degrees out of phase with the second output.

14. The method of claim 12, further comprising:

providing a first output from the first coil; and providing a second output from the second coil, the first output having a magnitude that is substantially the same as the second output.

15. The method of claim 12, further comprising passing the current through at least one of a spiral, circular, rectangular, or octagonal first and/or second coil.

16. A system, comprising:

a first metal trace disposed on a first base, the first metal trace having a first length equivalent to one-quarter of a predetermined wavelength;

a second metal trace disposed on a second base, the second metal trace having a second length equivalent to three-quarters of the predetermined wavelength;

a package to receive a die, the first and the second bases disposed on the package; and a Global System for Mobile Communication (GSM) transceiver coupled to the package, the GSM transceiver to operate at the predetermined wavelength.

17. The system of claim 16, wherein the first and/or the second metal trace includes a shape that is at least one of a circular shape, a spiral shape, rectangular shape, spiral shape, or octagonal shape.

18. The system of claim 16, wherein the first and the second metal traces forming an impedance transformer.

19. The system of claim 16, wherein the first and/or the second metal trace includes a shape that is at least one of a circular shape, a spiral shape, rectangular shape, spiral shape, or octagonal shape.

20. A method, comprising:

disposing a first base having a first coil on a package, the package to receive a die, the first coil having a first electrical length equivalent to one-quarter of a wavelength of an operating frequency of a radio frequency (RF) signal;

disposing a second base having a second coil on the package, the second coil having a second length equivalent to three-quarters of the wavelength; and coupling the first coil and the second coil to die bumps disposed on the package.

21. The method of claim 20, further comprising disposing the first and/or the second base having at least one of a spiral, circular, rectangular, or octagonal first and/or second coil on the package.

22. The method of claim 20, further comprising disposing the first and/or the second base having the first coil wound in the same direction as the second coil on the package.

* * * * *